United States Patent
Kanda et al.

(10) Patent No.: US 9,866,207 B2
(45) Date of Patent: Jan. 9, 2018

(54) SEMICONDUCTOR DEVICE, POWER CONTROL DEVICE AND ELECTRONIC SYSTEM

(71) Applicant: Renesas Electronics Corporation, Tokyo (JP)

(72) Inventors: Ryo Kanda, Tokyo (JP); Tetsu Toda, Tokyo (JP); Junichi Nakamura, Tokyo (JP); Kazuyuki Umezu, Tokyo (JP); Tomonobu Kurihara, Tokyo (JP); Takahiro Nagatsu, Tokyo (JP); Yasushi Nakahara, Tokyo (JP); Yoshinori Kaya, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/387,270

(22) Filed: Dec. 21, 2016

(65) Prior Publication Data

US 2017/0104474 A1   Apr. 13, 2017

Related U.S. Application Data

(63) Continuation of application No. 14/832,867, filed on Aug. 21, 2015, now Pat. No. 9,559,687.

(30) Foreign Application Priority Data

Aug. 25, 2014 (JP) ................. 2014-170091

(51) Int. Cl.
*H02P 27/04* (2016.01)
*H03K 3/356* (2006.01)
(Continued)

(52) U.S. Cl.
CPC ... *H03K 3/356182* (2013.01); *H01L 29/0696* (2013.01); *H01L 29/404* (2013.01);
(Continued)

(58) Field of Classification Search
CPC ....... H03K 17/6872; H03K 19/018521; H03K 5/24; H03K 17/567; H03K 17/687; H02P 27/04; H02P 27/06; H02P 27/08
(Continued)

(56) References Cited

U.S. PATENT DOCUMENTS 7,592,831 B2   9/2009   Locatelli et al.
8,841,744 B2   9/2014   Imai
(Continued)

OTHER PUBLICATIONS

United States Notice of Allowance dated Sep. 13, 2016 in U.S. Appl. No. 14/832,867.

*Primary Examiner* — Antony M Paul
(74) *Attorney, Agent, or Firm* — McGinn IP Law Group, PLLC

(57) ABSTRACT

A driver integrated circuit includes a bootstrap circuit (BSC) configured to output a boot power supply voltage (VB) based on a first power supply voltage, the boot power supply voltage being higher than the first power supply voltage; a level shift circuit (LSC) configured to output an output pulse signal based on an input pulse signal and the boot power supply voltage; a high side driving circuit (HSU) configured to output a high side driving voltage based on the boot power supply voltage and the output pulse signal, wherein the bootstrap circuit includes a sense metal oxide semiconductor (MOS) transistor and a boot MOS transistor, wherein the sense MOS transistor includes a depression-type transistor.

2 Claims, 12 Drawing Sheets

(51) Int. Cl.
*H01L 29/78* (2006.01)
*H01L 29/06* (2006.01)
*H01L 29/40* (2006.01)
*H03K 17/567* (2006.01)

(52) U.S. Cl.
CPC ........ *H01L 29/408* (2013.01); *H01L 29/7823* (2013.01); *H03K 17/567* (2013.01)

(58) Field of Classification Search
USPC .............. 318/400.01, 700, 727, 432, 400.26, 318/400.27, 400.28, 800, 801; 363/10, 363/40, 95, 120, 53, 55, 57, 60, 77, 109, 363/123, 159, 174, 175; 327/589, 562
See application file for complete search history.

(56) References Cited

U.S. PATENT DOCUMENTS 8,892,914 B2    11/2014  Huynh
9,438,239 B2 *  9/2016  Gao ...................... H02M 3/158

\* cited by examiner

SEMICONDUCTOR DEVICE, POWER CONTROL DEVICE AND ELECTRONIC SYSTEM

CROSS-REFERENCE TO RELATED APPLICATIONS

The present application is a Continuation application of U.S. patent application Ser. No. 14/832,867, filed on Aug. 21, 2015, which is based on Japanese Patent Application No. 2014-170091 filed on Aug. 25, 2014 including the specification, drawings and abstract is incorporated herein by reference in its entirety.

BACKGROUND

The present invention relates to a semiconductor device, a power control device, and an electronic system. The invention relates to a semiconductor device, a power control device, and an electronic system that are used, for example, in the field of power electronics.

For example, Patent Document 1 (U.S. Pat. No. 7,592,831) describes a configuration that configures a diode for bootstrap by means of a transistor to control ON and OFF of the transistor based on a comparator block. As shown in FIGS. 10 and 11 of Patent Document 1, the comparator block includes an LDMOS with a bootstrap voltage as drain input, an NMOS with a power voltage as drain input, and a current comparator for converting the source voltages of the LDMOS and the NMOS into currents to compare the two currents. The gates of the LDMOS and the NMOS are applied with "2× power voltage" at a predetermined timing.

SUMMARY

For example, in a driver IC (Integrated Circuit) and the like for driving a half bridge circuit or other equipment, a bootstrap circuit is required to drive a high side transistor. In general, the bootstrap circuit is configured with a diode and a capacitor and is implemented as an external component. At the same time, it is desirable to integrate the diode into the driver IC in order to reduce the size and cost of the system including the driver IC. However, the diode may be required to have a high pressure resistance at a level of several hundred V. For example, if a pn junction diode having such a high pressure resistance is integrated into the driver IC, there is a risk of a significant increase in the circuit area. In addition, the power consumption may also increase with a parasitic current.

Thus, for example, it may be a method of achieving the same function as diode by using a transistor as shown in Patent Document 1. However, in the method of Patent Document 1, the reduction in the circuit area and the associated reduction in the cost or the like may not be large enough. More specifically, for example, the circuit area increases in some locations of LDMOS which is a high withstand voltage element. In addition, a booster circuit or other equipment, such as LDMOS, is required to generate a gate voltage.

The following embodiments have been made in view of the above problems. These and other objects and advantages will become apparent from the following description of the present specification and the accompanying drawings.

A semiconductor device according to an embodiment is configured with a single semiconductor chip, in which a termination region with a ring-like shape as well as first and second regions are provided. The first region is provided outside the termination region in which a circuit is formed to operate with a first power supply voltage with the reference voltage as the reference. The second region is provided inside the termination region in which a circuit is formed to operate with a second power supply voltage with the floating voltage as the reference. The semiconductor device includes a high side driver formed in the second region, a level shift circuit, first and second transistors, and a comparator circuit. The level shift circuit converts the signal generated in the first region with the reference voltage as the reference into the signal with the floating voltage as the reference, and then outputs to the second region. The first transistor is formed in the termination region at a position between a first power supply terminal combined with the first power supply voltage and a second power supply terminal combined with the second power supply voltage. The second transistor is formed in the termination region at a position between the second power supply terminal and a sense node. The second transistor is driven by the first power supply voltage. The comparator circuit is formed in the first region to compare the voltage of the sense node and the first power supply voltage to control the ON/OFF of the first transistor. The second transistor is a depression type transistor.

According to one embodiment described above, it is possible to achieve a reduction in the size, and the like, of a power control device including a semiconductor device such as a driver IC, and of an electronic system.

DETAILED DESCRIPTION

Figure 1:
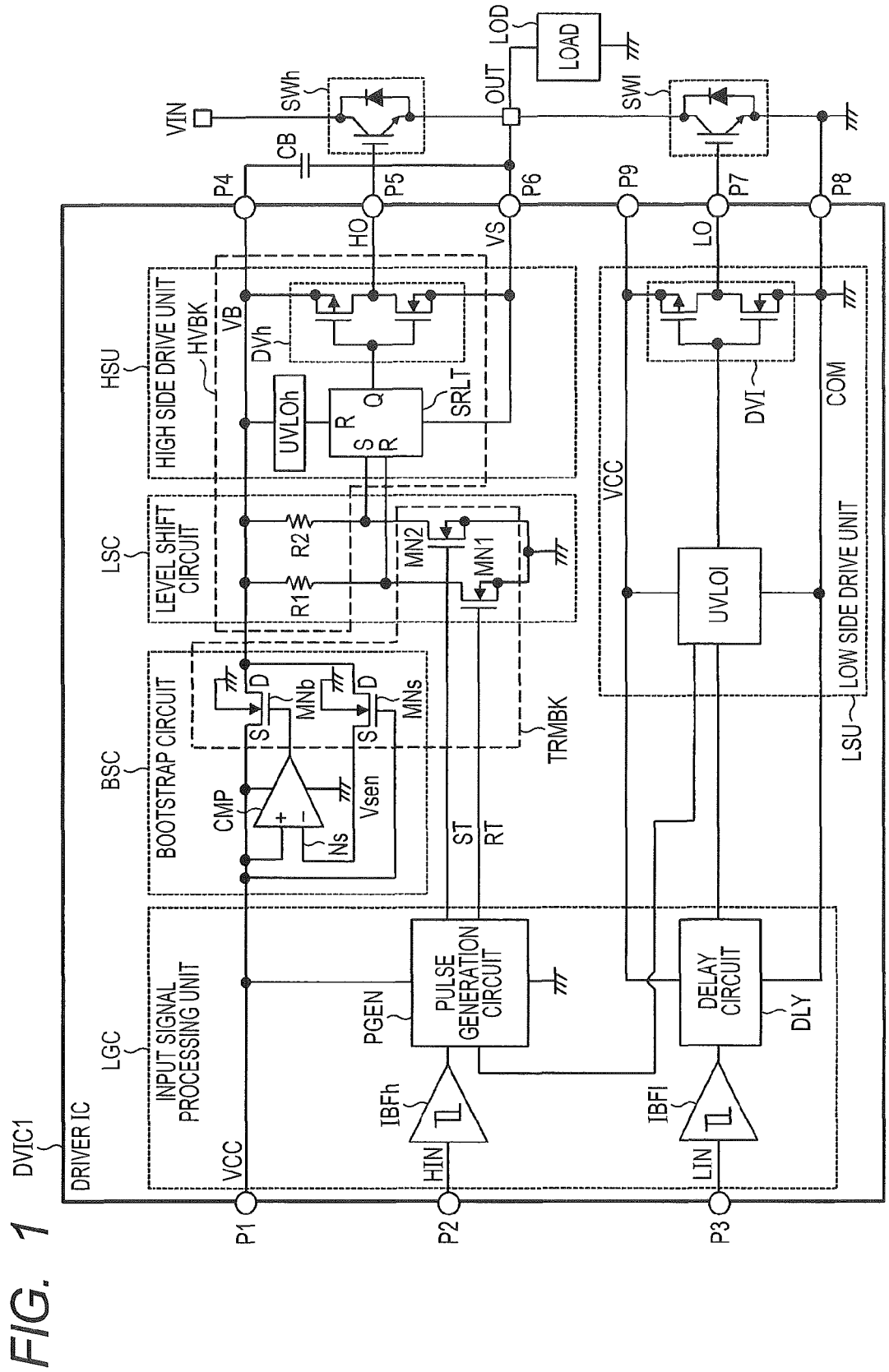
FIG. 1 is a circuit block diagram showing an example of the schematic configuration in a semiconductor device according to a first embodiment of the present invention.

In the following, embodiments will be described by dividing into a plurality of sections or embodiments if necessary for convenience, however, unless specifically stated otherwise, they are not unrelated to each other but have a relationship such that one is a variation, detail, supplementary explanation or the like of a part or whole of the other. Further, in the embodiments described below, when a reference is made to the number of elements (including the number, value, amount, range, and the like), the number is not limited to a specific number but may be more than or less than the specific number, unless otherwise specifically stated or it is clearly limited to the specific number apparent in principle.

Further, in the embodiments described below, it is needless to say that the components (including element steps and the like) are not necessarily essential unless otherwise specifically stated or it is clearly essential in principle. Similarly, in the embodiments described below, when a reference is made to the shape, positional relationship and the like of the components or the like, it is assumed that those substantially approximating or similar to the shape and the like are included unless otherwise specifically indicated or it is clearly not considered to be so in principle. This also applies to the value and range described above.

Further, in the embodiments, MOSFET (Metal Oxide Semiconductor Field Effect Transistor), which is hereinafter referred to as MOS transistor, is used as an example of MISFET (Metal Insulator Semiconductor Field Effect Transistor). However, the present invention does not exclude the use of non-oxide film as the gate insulating film. Further, in the embodiments, n-channel MOSFET is referred to as NMOS transistor and p-channel MOSFET is referred to as PMOS transistor.

Hereinafter, preferred embodiments of the present invention will be described in detail with reference to the accompanying drawings. Note that in all the drawings for describing the embodiments, the same or similar parts are in principle designated by the same reference numerals, and the repetitive description thereof will be omitted.

First Embodiment

Schematic Circuit Configuration of the Driver IC

FIG. 1 is a circuit block diagram showing an example of the schematic configuration in a semiconductor device according to a first embodiment of the present invention. A driver IC (semiconductor device) DVIC1 shown in FIG. 1 is configured with a single semiconductor chip, including a plurality of pads P1 to P9, an input signal processing unit LGC, a bootstrap circuit BSC, a level shift circuit LSC, a high side drive unit HSU, and a low side drive unit LSU. Further, here, in addition to the driver IC (DVIC1) there is also shown an example of the configuration of an electronic system including a high side switch SWh and a low side switch SWl, a bootstrap capacitor CB, and a load circuit LOD, which are provided outside the driver IC.

The pad (first power supply terminal) P1 is combined with a power supply voltage (first power supply voltage) VCC of, for example, 15 V or the like. A high side input signal HIN is input to the pad P2, and a low side input signal LIN is input to the pad P3. The high side input signal HIN and the low side input signal LIN are generated, for example, by a microcontroller (MCU: Micro Control Unit) or the like not shown.

The pad (second power supply terminal) P4 is combined with a boot power supply voltage (second power supply voltage) VB. The pad (load drive terminal) P6 is combined with a floating voltage VS as well as the load circuit LOD. The pad P6 outputs a load drive signal OUT to the load circuit LOD. A high side output signal HO is output to the pad P5. The pad P9 is combined with the power supply voltage VCC, and the pad (reference terminal) P8 is combined with a reference voltage COM of 0 V. A low side output signal LO is output to the pad P7. Note that the pad P9 may be integrated into the pad P1.

Here, the high side switch SWh is provided between a terminal (third power supply terminal) combined with an input power supply voltage (third power supply voltage) VIN as well as the pad (load drive terminal) P6. The ON/OFF of the high side switch SWh is controlled by the high side output signal HO. More specifically, the high side switch SWh is configured with a high side transistor and a flywheel diode, in which the high side transistor is driven by the high side output signal HO. The input power supply voltage VIN has, for example, a voltage value of 150 V or more, and preferably, a voltage value of 300 V or more with the reference voltage COM of 0 V as the reference. The bootstrap capacitor CB is provided between the pad (second power supply terminal) P4 and the pad (load drive terminal) P6.

The low side switch SWl is provided between the pad (load drive terminal) P6 and the pad (reference terminal) P8, in which the ON/OFF of the low side switch SWl is controlled by the low side output signal LO. More specifically, the low side switch SWl is configured with a low side transistor and a flywheel diode, in which the low side transistor is driven by the low side output signal LO. The floating voltage VS of the pad (load drive terminal) P6 remains in the range between 0 V and the input power supply voltage VIN according to the ON/OFF state of the high side switch SWh and the low side switch SWl. More precisely, the floating voltage VS may temporarily remain in a range wider than the range between 0 V and the input power supply voltage VIN, according to the counter electromotive voltage of the load circuit LOD.

For this reason, the high side transistor (SWh) and the low side transistor (SWl) are configured with a high withstand voltage element, represented by IGBT (Insulated Gate Bipolar Transistor), and in some cases such as a high voltage MOSFET or a high voltage bipolar transistor. Further, the boot power supply voltage (second power supply voltage) VB of the pad (second power supply terminal) P4 remains following the floating voltage VS of the pad (load drive terminal) P6 by the bootstrap capacitor CB.

An input signal processing unit LGC includes a high side input buffer IBFh, a low side input buffer IBFl, a pulse generation circuit PGEN, and a delay circuit DLY. The high side input buffer IBFh converts a high side input signal HIN that is input to the pad P2 into a signal of the power supply voltage VCC level, and outputs to the pulse generation circuit PGEN. The low side input buffer IBFl converts a low side input signal LIN that is input to the pad P3 into a signal of the power supply voltage VCC level, and outputs to the delay circuit DLY. Each of the input buffers IBFh and IBFl is configured, for example, with a Schmitt trigger circuit or the like to remove input noise.

The pulse generation circuit PGEN and the delay circuit DLY operate with the power supply voltage VCC with the reference voltage COM as the reference. The pulse generation circuit PGEN receives an output signal of the high side input buffer IBFh. Then, the pulse generation circuit PGEN generates a set signal ST at one of the rising or falling edges, and generates a reset signal RT at the other edge. Each of the set signal ST and the reset signal RT is, for example, a one-shot plus signal. The delay circuit DLY adds a delay (so-called dead time) to the output signal of the low side buffer IBFl so that the high side switch SWh and the low side switch SWl are not driven ON at the same time.

The high side drive unit HSU includes a high side driver DVh, an SR latch circuit SRLT, and a high side low voltage detection circuit UVLOh. These circuits operate with the boot power supply voltage (second power supply voltage) VB that is combined with the pad P4, with the floating voltage VS combined with the pad P6 as the reference. The high side driver DVh is configured with a CMOS inverter, and the like, with the output signal (Q) of the SR latch circuit SRLT as the input. The high side driver DVh outputs a high side output signal HO to the pad P5 to drive the high side transistor within the high side switch SWh.

The SR latch circuit SRLT controls the high side output signal HO through the high side driver DVh in response to a set input (S) and a reset input (R). More specifically, the SR latch circuit SRLT controls the high side output signal HO to the boot power supply voltage VB level in response to the set input (S), and controls the high side output signal HO to the level of the floating voltage VS in response to the reset input (R). When the value of the boot power supply voltage VB with the floating voltage VS as the reference does not reach a predetermined voltage value, the high side low voltage detection circuit UVLOh gives the reset input (R) to the SR latch circuit SRLT. As a result, the high side switch SWh is fixed in the OFF state until the value of the boot power supply voltage VB reaches the predetermined voltage value.

The level shift circuit LSC includes two NMOS transistors NM1, MN2 and two resisters R1, R2. In the present embodiment, the NMOS transistors (third and fourth transistors) MN1 and MN2 are hereinafter referred to as level shift MOS. With respect to the level shift MOS (third transistor) MN1, the source is combined with the reference voltage COM and the drain is combined with the pad P4 through the resistance R1. With respect to the level shift MOS (fourth transistor) MN2, the source is combined with the reference voltage COM and the drain is combined with the pad P4 through the resistance R2. As described above, the boot power supply voltage VB is applied between the source and drain of the level shift MOS (MN2, MN2), with the reference voltage COM as the reference. For this reason it is necessary that the level shift MOS (MN1, MN2) are a high withstand voltage element.

The level shift MOS (MN2) converts the voltage level of the set signal ST into the voltage level that fits the set input (S) of the SR latch circuit SRLT, by allowing a predetermined pulse current to flow through the resistance R2 in response to the set signal ST. Similarly, the level shift MOS (MN1) converts the voltage of the reset signal RT into the voltage level that fits the reset input (R) of the SR latch circuit SRLT, by allowing a predetermined pulse current to flow through the resistance R1 in response to the reset signal RT. In this way, the level shift circuit LSC has a function to convert the signal with the reference voltage COM as the reference into the signal with the floating voltage VS as the reference.

The low side drive unit LSU includes a low side driver DVl and a low side low voltage detection circuit UVLOl. These circuits operate with the power supply voltage VCC with the reference voltage COM as the reference. The low side driver DVl is configured with a CMOS inverter or the like with the output signal of the low side low voltage detection circuit UVLOl as the input. The low side driver DVl outputs the low side output signal LO to the pad P7 to drive the low side transistor within the low side switch SWl.

When the value of the power supply voltage VCC with the reference voltage COM as the reference does not reach a predetermined voltage value, the low side low voltage detection circuit UVLOl controls the low side output signal LO to the reference voltage COM level through the low side driver DVl. As a result, the low side switch SWl is fixed in the OFF state until the value of the power supply voltage VCC reaches the predetermined voltage value. Further, when the value of the power supply voltage VCC does not reach the predetermined voltage value, the low side low voltage detection circuit UVLOl sends a notification to the pulse generation circuit PGEN. Upon receiving the notification, the pulse generation circuit PGEN at least stops generating the set signal ST, and as a result, the high side switch SWh is also fixed in the OFF state until the value of the power supply voltage VCC reaches the predetermined voltage value. Note that when the value of the power supply voltage VCC reaches the predetermined voltage value, the low side low voltage detection circuit UVLOl outputs the output signal of the delay circuit LDY to the low side driver DVl.

The bootstrap circuit BSC includes two NMOS transistors MNb and MNs as well as a comparator circuit CMP. The NMOS transistor (first transistor) MNb is provided between the pad (first power supply terminal) P1 and the pad (second power supply terminal) P4. The NMOS transistor (second transistor) MNs is provided between the pad (second power supply terminal) P4 and the sense node Ns. The NMOS transistor MNs is driven by the power supply voltage (first power supply voltage) VCC. In the present embodiment, the NMOS transistor (first transistor) MNb is hereinafter referred to as boot MOS and the NMOS transistor (second transistor) MNs is hereinafter referred to as sense MOS.

With respect to the boot MOS (MNb), the source (S) is combined with the pad (first power supply terminal) P1 and the drain (D) is combined with the pad (second power supply terminal) P4. With respect to the sense MOS (MNs), the source (S) is combined with the sense node Ns and the drain (D) is combined with the pad (second power supply terminal) P4. The boot MOS (MNb) has a function that is equivalent to the bootstrap diode a general bootstrap circuit has. In this way, the potential difference between the power supply voltage VCC and the boot power supply voltage VB is applied to the boot MOS (MNb) between the source and the drain. For this reason, the boot MOS (MNb) should be a high withstand voltage element. Further, a similar potential difference is also applied to the sense MOS (MNs), so that the sense MOS (MNs) should also be a high withstand voltage element.

The comparator circuit CMP operates with the power supply voltage (first power supply voltage) VCC with the reference voltage COM as the reference. When the sense voltage Vsen of the sense node Ns is lower than the power supply voltage VCC, the comparator circuit CMP drives the boot MOS (first transistor) MNb to be ON. On the other hand, when the sense voltage Vsen is higher than the power supply voltage VCC, the comparator circuit CMP drives the boot MOS (first transistor) MNb to be OFF.

Here, the boot MOS (first transistor) MNb preferably uses a depression type structure. In this way, it is possible to drive the boot MOS (MNb) to be ON by the output of the power supply voltage VCC level from the comparator circuit CMP. At the same time, it is possible to transmit the power supply voltage level VCC of the boot MOS (MNb) from the source (S) to the drain (D). In other words, the voltage loss in the forward direction can be reduced to a lower level than the case of using a general bootstrap diode. Further, it is preferable that the sense MOS (second transistor) MNs also uses a depression type structure. In this way, it is possible to transmit a voltage exceeding the power supply voltage VCC from the drain (D) to the source (S), while using the power supply voltage VCC as the gate voltage of the sense MOS (MNs).

Figure 2:
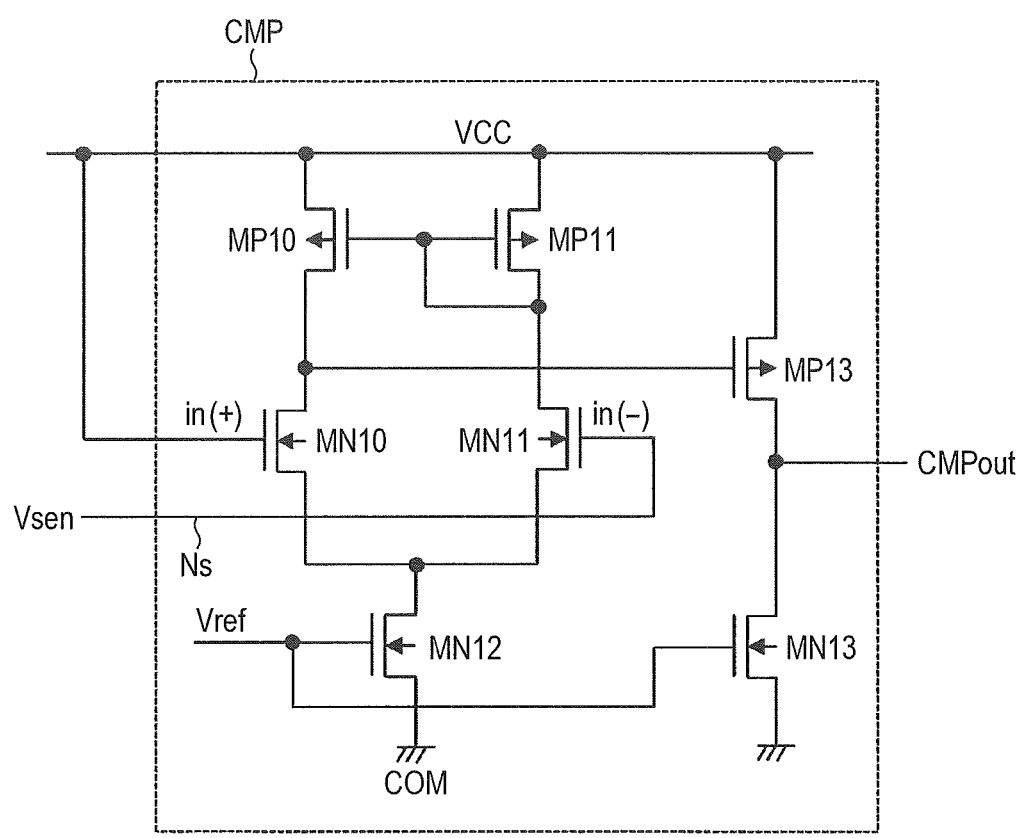
FIG. 2 is a circuit diagram showing an example of the configuration of a comparator circuit in the semiconductor device shown in FIG. 1.

FIG. 2 is a circuit diagram showing an example of the configuration of the comparator circuit in the semiconductor device shown in FIG. 1. The comparator circuit CMP shown in FIG. 2 includes NMOS transistors MN10 to MN13, and PMOS transistors MP10, MP11, and MP13. The NMOS transistors MN10 to MN12 and the PMOS transistors MP10 and MP11 configure a differential amplifier circuit. The NMOS transistor MN13 and the PMOS transistor MP13 configure a source grounded amplifier circuit.

The sources of the NMOS transistors MN10 and MN11 are commonly coupled to form a differential input part in the differential amplifier circuit. The power supply voltage VCC is input to the gate of the NMOS transistor MN10, and the sense voltage Vsen is input to the gate of the NMOS transistor MN11. Then, an output signal of the differential amplifier circuit is generated from the drain of the NMOS transistor MN10.

The NMOS transistor MN12 is provided between the source of the NMOS transistors MN10, MN11 and the reference voltage COM. The gate of the NMOS transistor MN12 is combined with a fixed voltage Vref to function as a tail current source of the differential amplifier circuit. The PMOS transistors MP10 and MP11 are provided between the drain of the NMOS transistors NM10, MN11 and the power supply voltage VCC. The gates of the PMOS transistors MP10 and MP11 are commonly coupled. Then, the gate and the drain of the PMOS transistor MP11 are combined to function as a load current source of the differential amplifier circuit.

The NMOS transistor MN13 is provided between the drain of the PMOS transistor MP13 and the reference voltage COM, and its gate is combined with the fixed voltage Vref to function as a load current source of the source grounded amplifier circuit. The source of the PMOS transistor MP13 is combined with the power supply voltage VCC. When an output signal of the differential amplifier circuit is received at the gate, the PMOS transistor MP13 generates an output signal CMPout of the comparator circuit CMP from the drain. The boot MOS (MNb) is driven ON or OFF by the output signal CMPout.

As described above, the comparator circuit CMP can be configured with a voltage comparator circuit or the like that operates with the power supply voltage VCC. Each of the MOS transistors (MN10 to MN13, MP10, MP11, and MP13) that configure the comparator circuit CMP is configured with an enhancement type MOS transistor. Here, the difference between the enhancement type and the depression type is described.

In the case of the enhancement type MOS transistor, a channel is not formed when the gate-source voltage is 0 V, and substantially no current flows even if there is a potential difference between the source and the drain. On the other hand, in the case of the depression type MOS transistor, a channel is previously formed by doping the semiconductor surface just below the gate, so that the current flows as long as there is a potential difference between the source and the drain, even if the gate-source voltage is 0 V. For example, the NMOS transistor MN11, which is an example of the enhancement type MOS transistor, is compared with the sense MOS (MNs) which is the depression type. When the gate-source voltage of each MOS transistor is 0 V and the source-drain voltages of the MOS transistors are the same, the source-drain current of the sense MOS (MNs) is greater than the source-drain current of the NMOS transistor MN11.

<Schematic Circuit Operation of the Driver IC>

Figure 3:
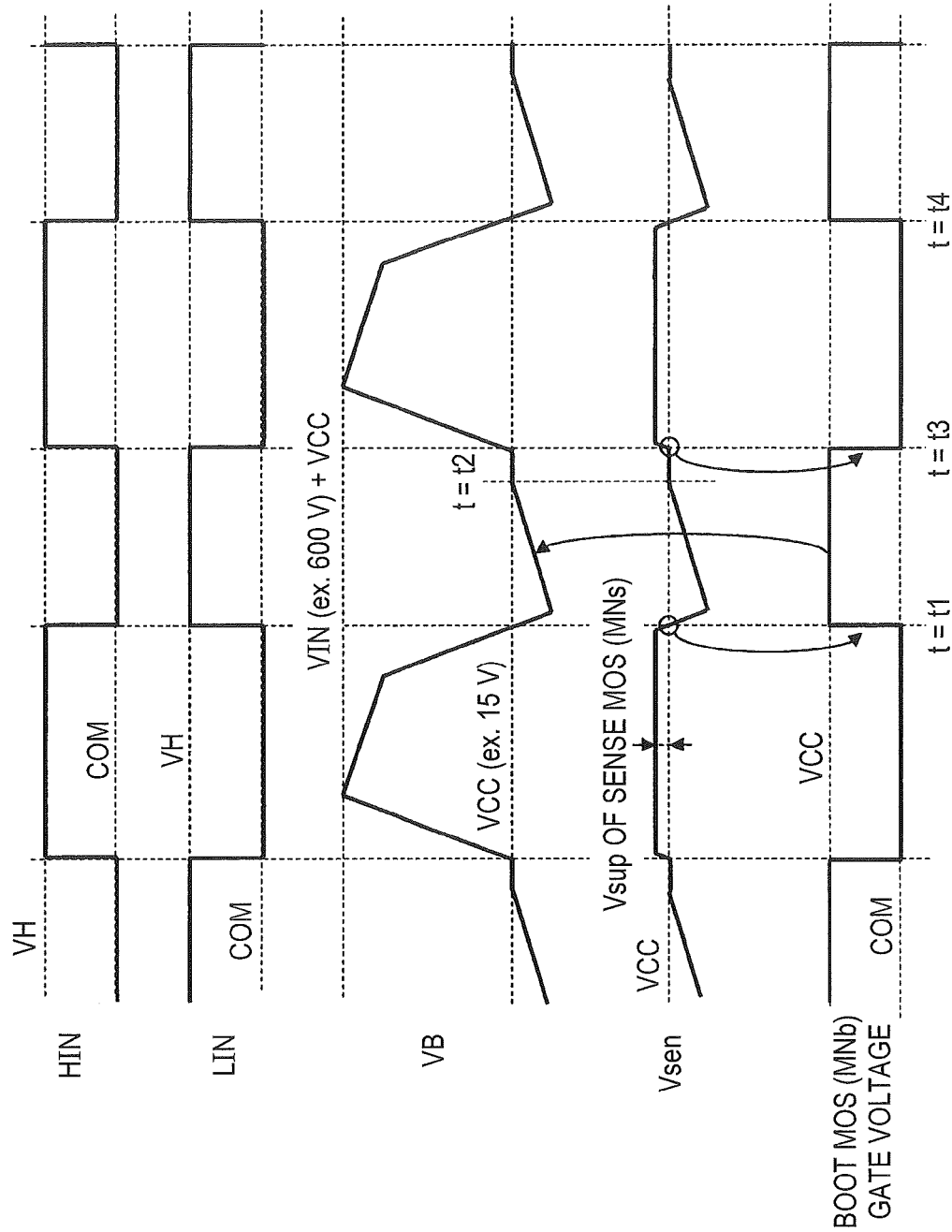
FIG. 3 is a waveform diagram showing an example of the schematic operation of the main part in the semiconductor device shown in FIG. 1.

FIG. 3 is a waveform diagram showing an example of the schematic operation of the main part in the semiconductor device shown in FIG. 1. Here, the operation is described with the assumption that the high side input signal HIN and the low side input signal LIN are input in a complementary manner for the sake of convenience. The high side input signal HIN and the low side input signal LIN change, for example, with L level as the reference voltage COM and with H level as the high potential-side voltage VH (for example, 5 V or the like).

First, in $t=t1$, the high side input signal HIN changes to the L level (while the low side input signal LIN changes to the H level). In this way, the low side switch SWl is driven ON (while the high side switch SWh is driven OFF). Then, the floating voltage VS is combined with the reference voltage COM. In this case, in general, the boot power supply voltage VB is higher than the reference voltage (0 V) COM and lower than the power supply voltage (for example, 15 V or the like) VCC.

Here, in the bootstrap circuit BSC, the depression type sense MOS (MNs) can transmit the boot power supply voltage VB to the sense node Ns until the boot power supply voltage VB exceeds "the power supply voltage VCC+Vsup", where Vsup is the up voltage associated with the depression type. In other words, when the boot power supply voltage VB is lower than "the power supply voltage VCC+Vsup", the sense voltage Vsen of the sense node Ns is equal to the boot power supply voltage VB.

In $t=t1$, the sense voltage Vsen (and the boot power supply voltage VB) is lower than the power supply voltage VCC, so that the depression type boot MOS (MNb) is controlled to be turned ON. As a result, the bootstrap capacitor CB is charged and the boot power supply voltage VB (and the sense voltage Vsen) rises to the power supply voltage VCC. Then, in $t=t2$, when the boot power supply voltage VB (and the sense voltage Vsen) reaches the power supply voltage VCC, the charging of the bootstrap capacitor CB is stopped.

After that, in $t=t3$, the high side input signal HIN changes to the H level (while the low side input signal LIN changes to the L level). In this way, the high side switch SWh is driven ON (while the low side switch SWl is driven OFF), and the floating voltage VS is combined with the input power supply voltage (for example, 600 V or the like) VIN. As a result, the boot power supply voltage VB rises to "the input power supply voltage VIN+the power supply voltage VCC" through the bootstrap capacitor CB charged with the power supply voltage VCC.

Further, in $t=T3$, when the boot power supply voltage VB is raised, the sense voltage Vsen (and the boot power supply voltage VB) is higher than the power supply voltage VCC. For this reason, the boot MOS (NMb) is controlled to be turned OFF. Note that the boot power supply voltage VB rises to "the input power supply voltage VIN+the power supply voltage VCC", and in this process, the sense voltage Vsen is controlled to "the power supply voltage VCC+Vsup".

In $t=t3$, when the high side switch SWh is driven ON, its drive power is supplied by the bootstrap capacitor CB. For this reason, the voltage held by the bootstrap capacitor CB decreases as time elapses. As a result, in $t=t4$, when the high side input signal HIN changes to the L level (while the low side input signal LIN changes to the H level) again, the boot power supply voltage VB is reduced to a level lower than the power supply voltage VCC for the amount of reduction in the voltage held by the bootstrap capacitor CB. In response to this, the same operation as that in t=t1 is performed.

As described above, by providing the depression type sense MOS (second transistor) MNs, it is possible to input the boot power supply voltage VB to the comparator circuit CMP in the range not exceeding "the power supply voltage VCC+Vsup". As a result, the comparator circuit CMP can be configured with a low withstand voltage element. In other words, if the sense MOS (second transistor) NMs is not provided, for example, the boot power supply voltage VB is directly input to the comparator circuit CMP, requiring the comparator to be configured with a high withstand device.

<Characteristics of the Sense MOS>

Figure 4:
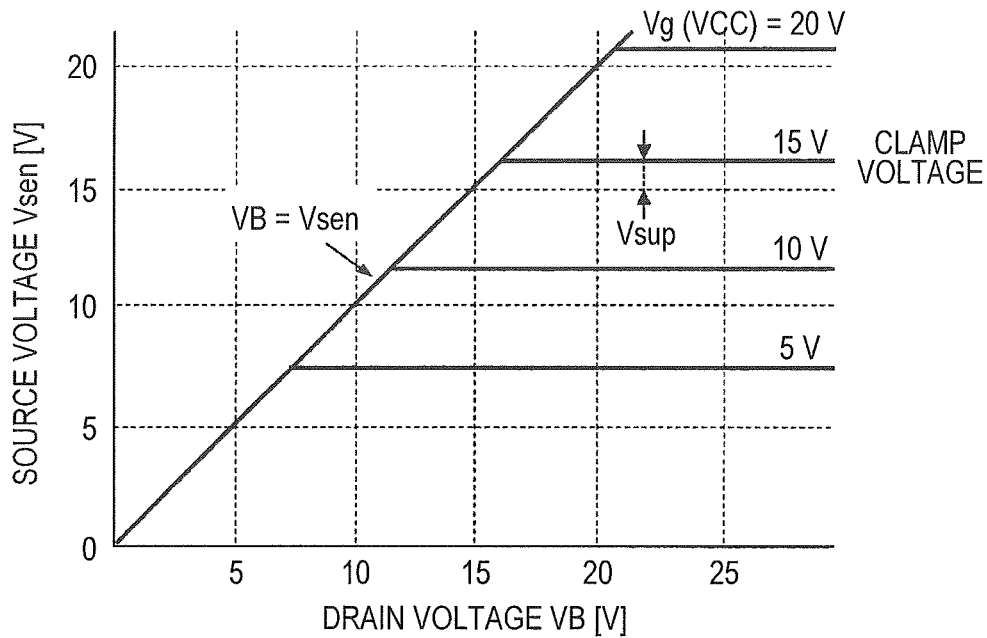
FIG. 4 is a view showing an example of the electrical characteristics of the sense MOS in the semiconductor device shown in FIG. 1.

FIG. 4 is a view showing an example of the electrical characteristics of the sense MOS of the semiconductor device shown in FIG. 1. As shown in FIG. 4, the depression type sense MOS (MNs) has characteristics such that the source voltage (namely, the sense voltage Vsen) is equal to the drain voltage (VB) in the range where the drain voltage (namely, the boot power supply voltage VB) does not exceed "the gate voltage Vg+Vsup". On the other hand, the sense MOS (MNs) has characteristics such that the source voltage (Vsen) is clamped to "the gate voltage Vg+Vsup" in the range where the drain voltage (VB) exceeds "the gate voltage Vg+Vsup".

Here, when the up voltage Vsup is increased, the operation margin of the comparator circuit CMP can be ensured for the amount of the increase. In other words, when the up voltage Vsup is small, the input margin is reduced as shown by t=3 to t4 in FIG. 3, when the comparator compares the power supply voltage VCC with "the power supply voltage VCC+Vsup" and drives the boot MOS (MNb) to the OFF level, and there is a risk that malfunction may occur. On the other hand, if the up voltage Vsup is increased, the maximum input voltage to the comparator circuit CMP is increased for the amount of the increase. As a result, the margin of the withstand voltage of the comparator circuit CMP (for example, the gate withstand voltage of the NMOS transistor MN11) is reduced. Thus, it is preferable that the up voltage Vsup is set to a value as large as possible in the range not exceeding the withstand voltage of the comparator circuit CMP.

<Schematic Layout Configuration of the Driver IC>

Figure 5:
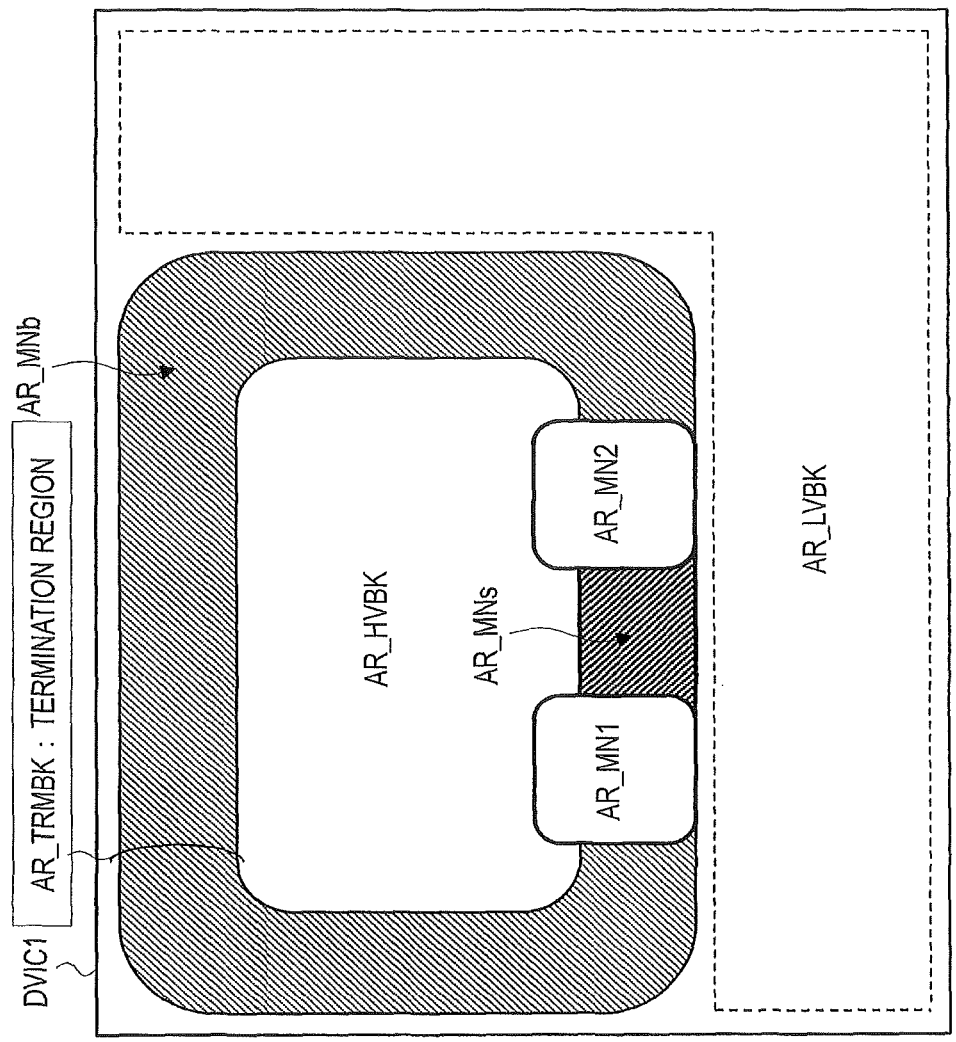
FIG. 5 is a plan view showing an example of the schematic layout configuration in the semiconductor device shown in FIG. 1.

FIG. 5 is a plan view showing an example of the schematic layout configuration in the semiconductor device shown in FIG. 1. A semiconductor device (driver IC) DVIC1 shown in FIG. 5 is configured with a single semiconductor chip. A termination region AR_TRMBK, a low voltage region (first region) AR_LVBK, and a high voltage region (second region) AR_HVBK are formed on the semiconductor chip. The termination region AR_TRMBK has a ring-like shape, which is a region to separate and combine a circuit operating with the power supply voltage VCC and a circuit operating with the boot power supply voltage VB.

Each of the circuits shown in the termination unit TRMBK of FIG. 1 is formed in the termination region AR_TRMBK. More specifically, the termination region AR_TRMBK is provided with a region AR_MN1 of the level shift MOS (third transistor) MN1, a region AR_MN2 of the level shift MOS (fourth transistor) MN2, a region AR_MNb of the boot MOS (MNb), and a region AR_NMs of the sense MOS (MNs). In this way, a transistor with a withstand voltage of, for example, 150 V or more, and preferably 300 V or more between the source and the drain is formed in the termination region AR_TRMBK.

The low voltage region (first region) AR_LVBK is provided outside the termination region AR_TRMBK, in which a circuit operating with the power supply voltage (first power supply voltage) VCC with the reference voltage COM as the reference is formed. More specifically, the input signal processing unit LGC, the low side drive unit LSU, and the comparator circuit CMP within the bootstrap circuit BSC, which are shown in FIG. 1, are formed in the low power region AR_LVBK.

The high voltage region (second region) AR_HVBK is provided inside the termination region AR_TRMBK, in which a circuit operating with the boot power supply voltage (second power supply voltage) with the floating voltage VS as the reference is formed. More specifically, as shown in the high voltage circuit unit HVBK in FIG. 1, the high side drive unit HSU and the resistances R1, R2 within the level shift circuit LSC are formed in the high voltage region AR_HVBK.

Figure 6:
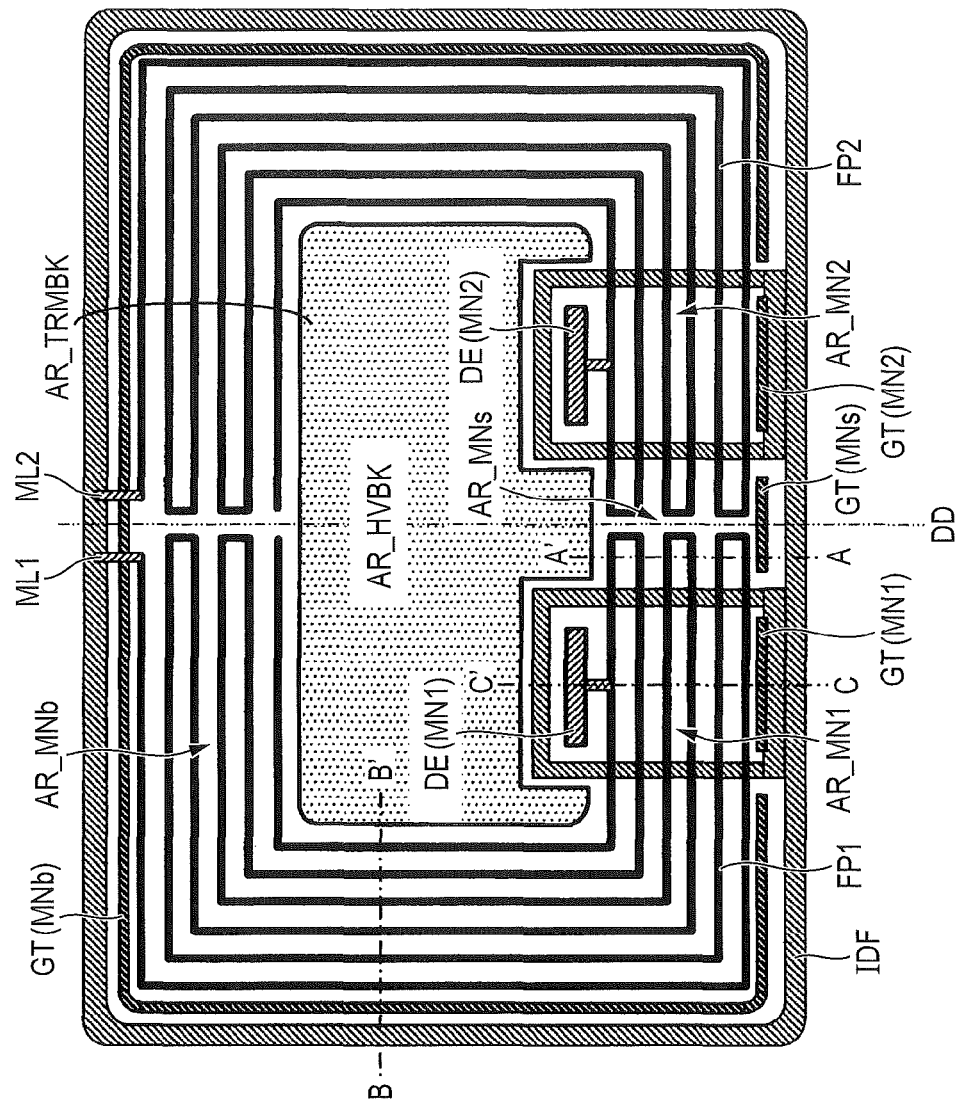
FIG. 6 is a plan view showing an example of a detailed layout configuration of the termination region in FIG. 5.

FIG. 6 is a plan view showing an example of a detailed layout configuration of the termination region in FIG. 5. The termination region AR_TRMBK has a ring-like shape. For example, a separation layer IDF, which is a p-type semiconductor region, is provided on the outer periphery of the ring. Further, the separation layer IDF is provided so as to surround the region AR_MN1 of the level shift MOS (MN1) as well as the region AR_MN2 of the level shift MOS (MN2).

In the inner region between the outer and inner peripheries of the ring, there are formed two field plates FP1 and FP2, gate layers GT (MN1) and GT (MN2) of the level shift MOS (MN1, MN2), a gate layer GT (MNb) of the boot MOS (MNb), and a gate layer GT (MNs) of the sense MOS (MNs). Each of the field plates FP1, FP2 and each of the gate layers GT (MN1), GT (MN2) GT (MNb) and GT (MNs) is formed, for example, of polysilicon or the like.

The field plate FP1 is formed in one region of the two equal parts of the inner region of the ring, and the field plate FP2 is formed in the other remaining region. Each of the field plates FP1 and PF2 extends along the circumferential direction, extending from the inner peripheral side to the outer peripheral side (or from the outer peripheral side to the inner peripheral side) while turning back at the boundary line DD. Each of the gate layers GT (MN1), GT (MN2), GT (MNb), and GT (NMs) is provided so as to extend in the circumferential direction of the ring between the outermost field plates FP1, FP2 and the separation layer IDF.

The field plate FP1 is combined with a drain electrode DE (MN1) of the level shift MOS (MN1) at the innermost periphery of the ring. Then, the field plate FP1 is combined with the separation layer IDF through a metal line ML1 at the outermost periphery of the ring. Similarly, the field plate FP2 is combined with a drain electrode DE (MN2) of the level shift MOS (MN2) on the innermost periphery of the ring. Then, the field plate FP is combined with the separation layer IDF through a metal liner ML2 on the outermost periphery of the ring.

As described above, by forming not only the level shift MOS (MN1, MN2) but also the boot MOS (MNb) and the sens MOS (MNs) in the termination region AR_TRMBK, it is possible to configure the driver ID (DVIC1) of FIG. 1 without increasing the area of the semiconductor chip.

Here, as can be seen from the arrangement of the gate layers GT (MNb) and GT (MNs), each of the boot MOS (MNb) and the sense MOS (MNs) is formed in such a way that the circumferential direction of the ring in the termination region AR_TRMBK is the gate width. The gate width of the boot MOS (first transistor) MNb (namely, the wiring length of the gate layer GT (MNb)) is greater than the gate width of the sense MOS (second transistor) NMs (namely, the wiring length of the gate layer GT (MNs)). As described in FIGS. 1 and 3, the boot MOS (MNb) preferably has a low resistance because it is necessary to charge the bootstrap capacitor CB. On the other hand, the resistance of the sense MOS (MNs) may have a higher resistance than the boot MOS (MNb) because little current flows through the sense MOS (MNs). For this reason, it is useful to provide a difference in the gate width as shown in FIG. 6.

Further, the boot MOS (first transistor) MNb is formed in a region between the region AR_MN1 of the level shift MOS (third transistor) MN1 and the region AR_MN2 of the level shift MOS (fourth transistor) MN2, which is on the side of the longer distance in the circumferential direction of the ring. On the other hand, the sense MOS (second transistor) MNs is formed in a region between the region AR_MN1 and the region AR_MIN2, which is on the side of the shorter distance in the circumferential direction of the ring. In this way, it is possible to provide a difference in the gate width as described above and, as a result, to improve the efficiency of the layout which will be described in detail with reference to FIG. 7.

<Device Structure of the Sense MOS and the Boot MOS>

Figure 7:
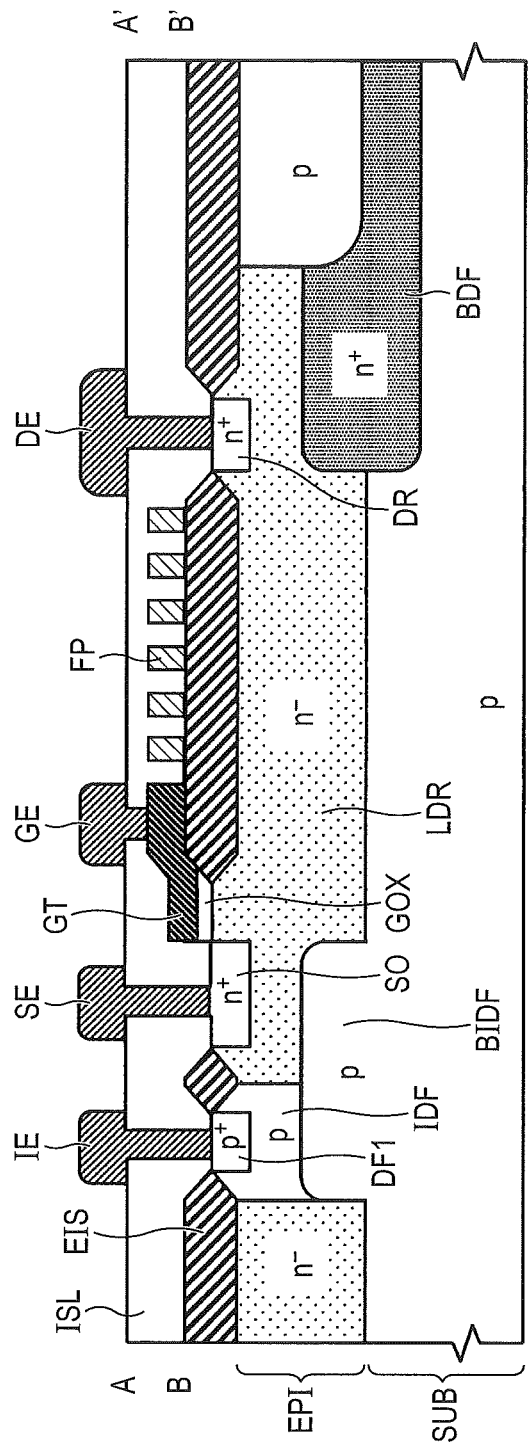
FIG. 7 is a cross-sectional view showing an example of an A-A' or B-B' structure in FIG. 6.

FIG. 7 is a cross-sectional view showing an example of an A-A' or B-B' structure in FIG. 6. In FIG. 7, an n⁻ type epitaxial layer EPI is provided on a p type semiconductor substrate SUB. The epitaxial layer EPI is divided by the p type separation layer IDF that extends from the side of the main surface (namely, the device formation surface) so as to be coupled to the semiconductor substrate SUB. One of the sections of the divided epitaxial layer EPI is a drift layer LDR corresponding to the inner region of the ring described with reference to FIG. 6.

On the main surface side of the separation layer IDF, a p⁺ type diffusion layer DF1 in which an impurity concentration is lower than that of the p type. The diffusion layer DF1 is combined with a separation electrode IE formed by a contact layer and a metal layer. On the main surface side of the drift layer LDR at a position close to the separation layer IDF, an n+ type source diffusion layer SO with an impurity concentration higher than that of the n⁻ type is provided. The source diffusion layer SO is combined with a source electrode SE formed by a contact layer and a metal layer.

On the drift layer LDR at a position adjacent to the source diffusion layer SO, a gate layer GT of polysilicon or the like is provided through a gate insulating film GOX. The region just below the gate insulating film GOX in the drift layer LDR is a channel region. The gate layer GT is combined with a gate electrode GE formed by a contact layer and a metal layer. There is provided an n⁺ type drain diffusion layer DR on the main surface side of the drift layer LDR at a position far from the separation layer IDF. The drain diffusion layer DR is combined with a drain electrode DE formed by a contact layer and a metal layer. The drain electrode DE, the gate electrode GE, the source electrode SE, and the separation electrode IE are separated accordingly by an inter-layer insulating film ISL.

There is provided a device separation insulating film EIS on the main surface side of the drift layer LDR at a position between the drain diffusion layer DR and the channel region. As described in FIG. 6, the field plate FP of polysilicon or the like is provided on the device separation insulating film EIS. A p type embedded separation layer BIDF is provided on the semiconductor substrate SUB at a position below the source diffusion layer SO. The embedded separation layer BIDF is provided in such a way that it is coupled to the semiconductor substrate SUB and to the separation layer IDF. An n⁺ type embedded diffusion layer BDF is provided between the semiconductor substrate SUB and the drift layer LDR at a position below the drain diffusion layer DR. The embedded diffusion layer BDF extends all over the high voltage region AR_HVBK shown in FIG. 6, and has a role to electrically separate the semiconductor substrate SUB and the high voltage region AR_HVBK.

By using such a structure, it is possible to achieve the depression type high withstand pressure NMOS transistor. Here, when the NMOS transistor is controlled to be turned OFF, a depletion layer formed between the embedded separation layer BIDF and the drift layer LDR is coupled to a depletion layer formed in the channel region. As a result, the current path is blocked. At this time, the provision of the embedded separation layer BIDF is useful for easy blocking of the current path on the lower side of the source diffusion layer SO. Note that the adjustment of the up voltage Vsup described in FIG. 4 can be performed, for example, with the impurity concentration in the channel region, the size of the separation layer BIDF, or other factors as the parameters.

Further, both the sense MOS (MNs) corresponding to the line A-A' in FIG. 6 and the boot MOS (MNb) corresponding to the line B-B' in FIG. 6 can use the structure of FIG. 7. In the case of the sense MOS (MNs), the separation electrode IE is combined with the reference voltage COM, the source electrode SE is combined with the comparator circuit CMP formed in the low voltage region AR_LVBK, and the gate electrode GE is combined with the power supply voltage VCC. While in the case of the boot MOS (MNb), the separation electrode IE is combined with the reference voltage COM, the source electrode SE is combined with the power supply voltage VCC, and the gate electrode GE is combined with the comparator circuit CMP.

Here, the connection destination of the source electrode SE of the boot MOS (MNb) is different from the connection destination of the source electrode SE of the sense MOS (MNs). For this reason, it is necessary to separate the source diffusion layer SO. At this time, as shown in FIGS. 5 and 6, it is useful to adopt a layout that separates the boot MOS (MNb) and the sense MOS (MNs) by the respective level shift MOS (MN1, MN2). In other words, the separation of the source diffusion layer SO can be achieved by using the separation layer IDF surrounding the level shift MOS (MN1, MN2) as shown in FIG. 6. In this way, it is possible to improve the efficiency of the layout.

As described above, it is preferable that the boot MOS (MNb) and the sense MOS (MNs) are arranged as shown in FIGS. 5 and 6, but the present invention is not limited to this arrangement. For example, when a region for separating the source diffusion layer SO is provided separately, it is possible that two level shift MOS (MN1, MN2) are arranged side by side and that the boot MOS (MNb) and the sense MOS (MNs) are arranged side by side in the remaining portion of the region.

<Device Structure of the Sense MOS and the Boot MOS (Variation)>

Figure 8:
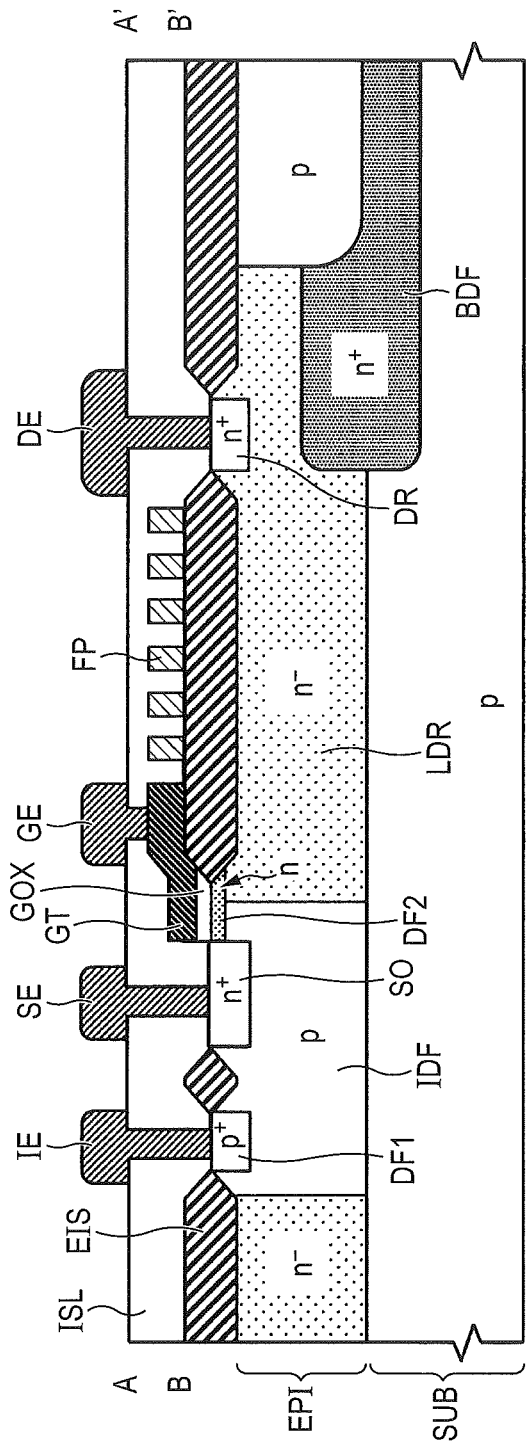
FIG. 8 is a cross-sectional view showing an example of an A-A' or B-B' structure in FIG. 6, which is different from the configuration example in FIG. 7.

FIG. 8 is a cross sectional view showing an example of an A-A' or B-B' structure, which is different from the structure of FIG. 7. The structure example shown in FIG. 8 is different from the structure shown in FIG. 7 in that the embedded separation layer BIDF is not provided, the p type separation layer IDF extends below the gate insulating film GOX beyond the source diffusion layer SO, and an n type diffusion layer DF2 is provided just below the gate insulating film GOX. Because of this structure, the source diffusion layer SO is provided within the separation layer IDF. The other structure is the same as that of FIG. 7, and a detailed description thereof will be omitted here.

The impurity concentration in the n type is higher than in the n⁻ type and lower than in the n⁺ type. The diffusion layer DF2 is provided in such a way that the source diffusion layer SO and the drift layer LDR are combined between the p type diffusion layer IDF and the gate insulating film GOX. Also by using such a structure, it is possible to achieve the depression type high withstand voltage NMOS transistor. The adjustment of the up voltage Vsup is performed, for example, with the impurity concentration of the diffusion layer DF2 as the parameter.

<Device Structure of the Level Shift MOS>

Figure 9:
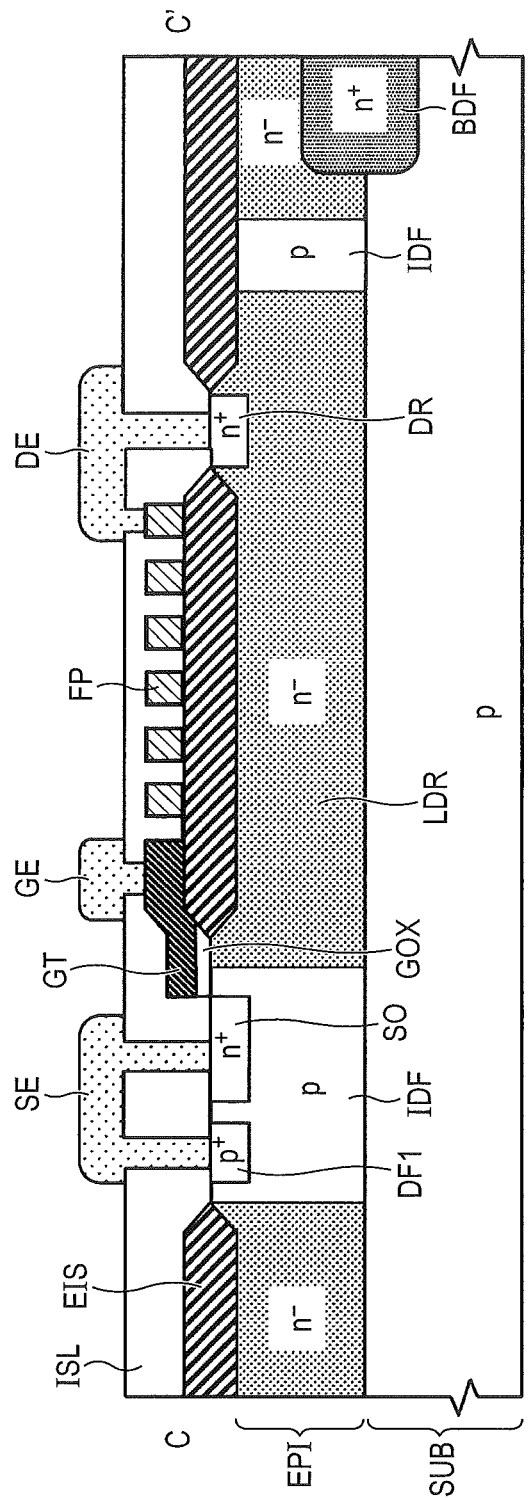
FIG. 9 is a cross-sectional view showing an example of a C-C' structure in FIG. 6.

FIG. 9 is a cross-sectional view showing an example of a C-C'structure in FIG. 6. The example of the structure of the level shift MOS (MN1, MN2) shown in FIG. 9 is different from the structure example of FIG. 8 in that the diffusion layer DF2 is not provided, and the separation layer IDF is provided next to the drain electrode DE as shown in FIG. 6. Further, there is also a difference in that the separation electrode IE and the source electrode SE are common to the source electrode SE, and an end of the field plate FP is coupled to the drain electrode DE as shown in FIG. 6. The other structure is the same as that of FIG. 8, and a detailed description thereof will be omitted here.

The separation layer IDF next to the drain electrode DE extends from the main surface side so as to be coupled to the semiconductor substrate SUB, similarly to the case of the separation layer IDF on the side of the source electrode SE (separation electrode IE). Then, the epitaxial layer EPI separated by the two separation layers IDF is the drift layer LDR. The embedded diffusion layer BDF is provided in the epitaxial layer EPI, instead of in the drift layer LDR, on the side facing the drift layer LDR with the separation layer IDF interposed on the side of the drain electrode DE.

The source electrode SE is combined with the reference voltage COM. The gate electrode GE is combined with the pulse generation circuit PGEN formed in the low voltage region AR_LVBK in FIG. 5. Then, the drain electrode DE is combined with the resistances R1 and R2 formed in the high voltage region AR_HVBK in FIG. 5, as well as the high side drive unit HSU. The drain voltages of the respective level shift MOS (MN1, MN2) are controlled independently. Thus, each of the regions AR_MN1 and AR_MN2 is surrounded by the separation layer IDF as shown in FIG. 6. Different from the boot MOS (MNb) and sense MOS (MNs) described above, the level shift MOS (MN1, MN2) are configured with an enhancement type NMOS transistor. In other words, the level shift MOS (MN1, MN2) operates with the p type separation layer IDF just below the gate insulating film GOX in FIG. 9 as the channel region.

Here, the field plate FP shown in FIG. 9 is coupled to the drain electrode on the side close to the drain electrode DE as described in FIG. 6. Further, although not shown in FIG. 9, the field plate FP is coupled to the separation layer IDF (namely, the reference voltage COM) on the side close to the source electrode SE. As a result, the voltage of the field plate FP is gradually reduced. By providing such a voltage gradient, it is possible to achieve uniformly spreading or the like of the depletion layer formed in the drift layer LDR.

Further, in the example of FIG. 6 described above, the two field plates FP1 and FP2 are provided in such a way that one end of the field plate FP1 is coupled to the drain electrode DE of the level shift MOS (MN1) and one end of the field plate FP2 is coupled to the drain electrode DE of the level shift MOS (MN2). In this way, in the separation layer IDF surrounding the level shift MOS (MN1), it is possible to prevent the occurrence of a parasitic MOS with the field plate FP1 as the gate, the drift layer LDR of the level shift MOS (MN1) as the source, and the drift layer LDR of the boot MOS (MNb) or the sense MOS (MNs) as the drain. Similarly also in the separation layer IDF surrounding the level shift MOS (MN2), it is possible to prevent the occurrence of a parasitic MOS with the field plate FP2 as the gate.

<Typical Effects and the Like of the First Embodiment>

As described above, typically by using the semiconductor device of the first embodiment, it is possible to incorporate the same function as the bootstrap diode into the semiconductor device while suppressing the increase in the circuit area of the semiconductor device (driver IC (DVIC1)). As a result, it is possible to achieve a reduction in the size, cost, and the like of the semiconductor device including the electronic system, and the like.

More specifically, such effects can be obtained by forming the sense MOS (MNs) and the boot MOS (MNb) in the termination region AR_TRMBK as shown in FIGS. 5 and 6. In addition, such effects can also be obtained by using a depression type high withstand voltage NMOS transistor for the sense MOS (MNs). In other words, by using the depression type high withstand voltage NMOS transistor, for example, there is no need to use a booster circuit or the like to generate "2× power supply voltage" such as shown in Patent Document 1.

Second Embodiment

Schematic Circuit Configuration of the Electronic System

Figure 10:
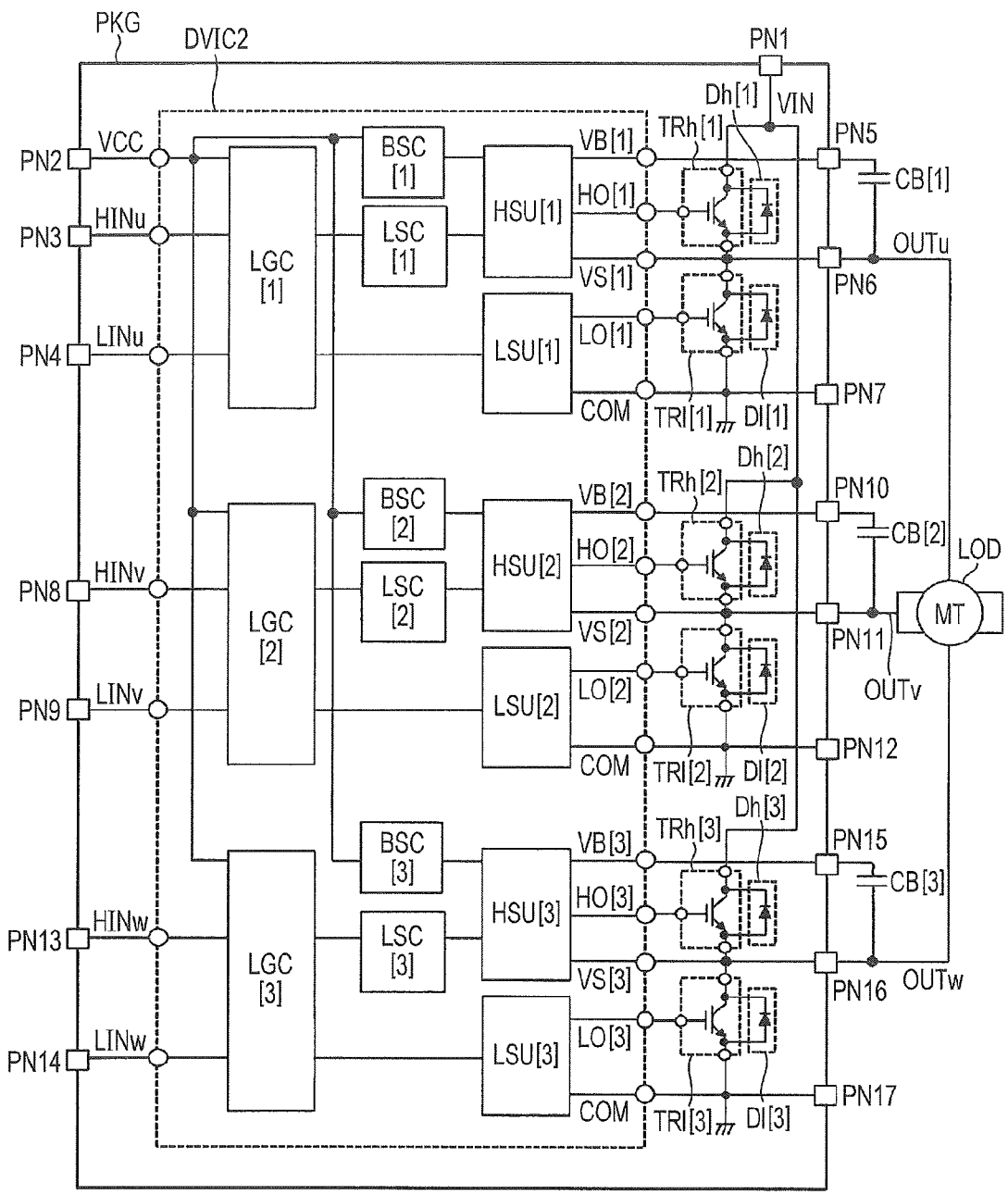
FIG. 10 is a circuit block diagram showing an example of the schematic configuration in an electronic system according to a second embodiment of the present invention.

FIG. 10 is a circuit block diagram showing an example of the schematic configuration in an electronic system according to a second embodiment of the present invention. An electronic system (for example, a three-phase inverter system) shown in FIG. 10 includes a power control device PKG configured with a single package, three bootstrap capacitors CB [1] to CB [3] which are external parts of the power control device, and a load circuit LOD. Although not particularly limited, the load circuit LOD is, for example, a motor MT or the like used in an inverter air conditioner. The motor MT is driven by a three-phase bridge inverter using an external power supply voltage of 150 V or more and more particularly, for example, about 400 V.

The power control device PKG includes a plurality of external pins PN1 to PN17. Further, the power control device PKG includes, within the package thereof, a driver ID (semiconductor device) DVIC2, three high side transistors TRh[1] to TRh [3], three low side transistors TRl [1] to TRl [3], three high side diodes Dh [1] to Dh [3], and three low side diodes Dl [1] to Dl [3]. Each of the transistors (TRh [1] to TRh [3], TRl [1] to TRl [3]) is, for example, an IGBT or the like. Each of the diodes (Dh [1] to Dh [3], Dl [1] to Dl [3]) is a flywheel diode.

The external pin (third power supply terminal) PN1 is combined with the external power supply voltage (third power supply voltage) VIN of hundreds of V (for example, 400 V or the like). The external pin (first power supply terminal) PN2 is combined with the power supply voltage (second power supply voltage) VCC. A U-phase high side input signal HINu of the input signals of three phases (U, V, W) is input to the external pin PN3. A U-phase low side input signal LINu is input to the external pin PN4.

The external pin (second power supply terminal) PN5 is combined with the boot power supply voltage (second power supply voltage) VB [1]. The external pin (load drive terminal) PN6 is combined with the floating voltage VS [1]. At the same time, the external pin (load drive terminal) PN6 is also combined with the load circuit LOD, and outputs a U-phase load drive signal OUTu to the load circuit LOD. The external pin (reference terminal) PN7 is combined with the reference voltage COM.

The external pins PN8 to PN12 are external pins for the V phase, corresponding to each of the external pins PN3 to PN6 for the U phase. Similarly, the eternal pins PN13 to PN17 are external pins for the W phase, corresponding to each of the external pins PN3 to PN6 for the U phase. Note that the external pin (third power supply terminal) PN1 and the external pin (first power supply terminal) PN2 are commonly used in the U, V, and W phases.

To explain it briefly, the V-phase high side input signal HIHv and the V-phase low side input signal LINv are input to the external pins PN8 and Pn9, respectively. The external pins PN10 and PN12 are combined with the boot power supply voltage VB [2] and the reference voltage COM, respectively. The external pin PN11 is combined with the floating voltage VS [2] and outputs a V-phase load drive signal OUTv to the load circuit LOD.

Similarly, the W-phase high side input signal HINw and the W-phase low side input signal LINw are input to the external pins PN13 and PN14, respectively. The external pins PN15 and PN17 are combined with the boot power supply voltage VB [3] and the reference voltage COM, respectively. The external pin PN16 is combined with the floating voltage VS [3] and outputs a W-phase load drive signal OUTw to the load circuit LOD.

The bootstrap capacitor CB [1] is provided between the external pin (second power supply terminal) PN5 and the external pin (load drive circuit) PN6. The bootstrap capacitor CB [2] is provided between the external pin (second power supply terminal) PN10 and the external pin (load drive terminal) PN11. The bootstrap capacitor CB [3] is provided between the external pin (second power supply terminal) PN15 and the external pin (load drive terminal) PN16.

The high side transistor TRh [1] and the high side diode Dh [1], which configure a high side switch for the U phase, are provided between the external pin (third power supply terminal) PN1 and the external pin (load drive terminal) PN6. The low side transistor TRl [1] and the low side diode Dl [1], which configure a low side switch for the U phase, are provided between the external pin (load drive terminal) PN6 and the external pin (reference terminal) PN7.

The high side transistor TRh [2] and the high side diode Dh [2], which configure a high side switch for the V phase, are provided between the external pin (third power supply terminal) PN1 and the external pin (load drive terminal) PN11. The low side transistor TRl [2] and the low side diode Dl [2], which configure a low side switch for the V phase, are provided between the external pin (load drive terminal) PN11 and the external pin (reference terminal) PN12.

The high side transistor TRh [3] and the high side diode Dh [3], which configure a high side switch for the W phase, are provided between the external pin (third power supply terminal) PN1 and the external pin (load drive terminal) PN16. Then, the low side transistor TRl [3] and the low side diode Dl [3], which configure a low side switch for the W phase, are provided between the external pin (load drive terminal) PN16 and the external pin (reference terminal) PN17.

The driver IC (semiconductor device) DVIC2 has a configuration including three sets of each of the circuit blocks within the driver IC (DVIC1) shown in FIG. 1. In other words, the driver IC (DVIC2) includes, as circuit blocks for the U phase, a high side drive unit HSU [1], a low side drive unit LSU [1], a level shift circuit LSC [1], an input signal processing unit LGC [1], and a bootstrap circuit BSC [1].

Further, the driver IC (DVIC)2 includes, as circuit blocks for the V phase, a high side drive unit HSU [2], a low side drive unit LSU [2], a level shift circuit LSC [2], an input signal processing unit LGC [2], and a bootstrap circuit BSC [2]. Similarly, the driver IC (DVIC2) includes, as circuit blocks for the W phase, a high side drive unit HSU [3], a low side drive unit LSU [3], a level shift circuit LSC [3], an input signal processing unit LGC [3], and a bootstrap circuit BSC [3].

For example, in the circuit blocks for the U phase, the pads P2, P3, P4, P6, and P8 shown in FIG. 1 are combined with the external pins PN3, PN4, PN5, PN6, and PN7, respectively. The pad P5 shown in FIG. 5 is combined with the gate of the high side transistor TRh [1] and outputs a U-phase high side output signal HO [1]. The pad P7 shown in FIG. 7 is combined with the gate of the low side transistor TRl [1] and outputs a U-phase low side output signal LO [1].

Similarly in the circuit blocks for the V and W phases, each pad is combined with the corresponding external pin as well as the gate of the corresponding transistor. For example, in the circuit blocks for the V phase, the pad P5 is combined with the gate of the high side transistor TRh [2] and outputs a V-phase high side output signal HO [2]. The pad P7 is combined with the gate of the low side transistor TRl [2] and outputs a V-phase low side output signal LO [2].

Similarly in the circuit blocks for the W phase, the pad P5 is combined with the gate of the high side transistor TRh [3] and outputs a W-phase high side output signal HO [3]. The pad P7 is combined with the gate of the low side transistor TRl [3] and outputs a W-phase low side output signal LO [3]. Note that the pad (first power supply terminal) P1, which is combined with the power supply voltage (first power supply voltage) VCC shown in FIG. 1, is combined with the external pin (first power supply terminal) PN2, and is commonly used in each of the circuit blocks for the U, V, and W phases within the driver IC (DVIC2).

<Schematic Layout Configuration of the Driver IC (Application)>

Figure 11:
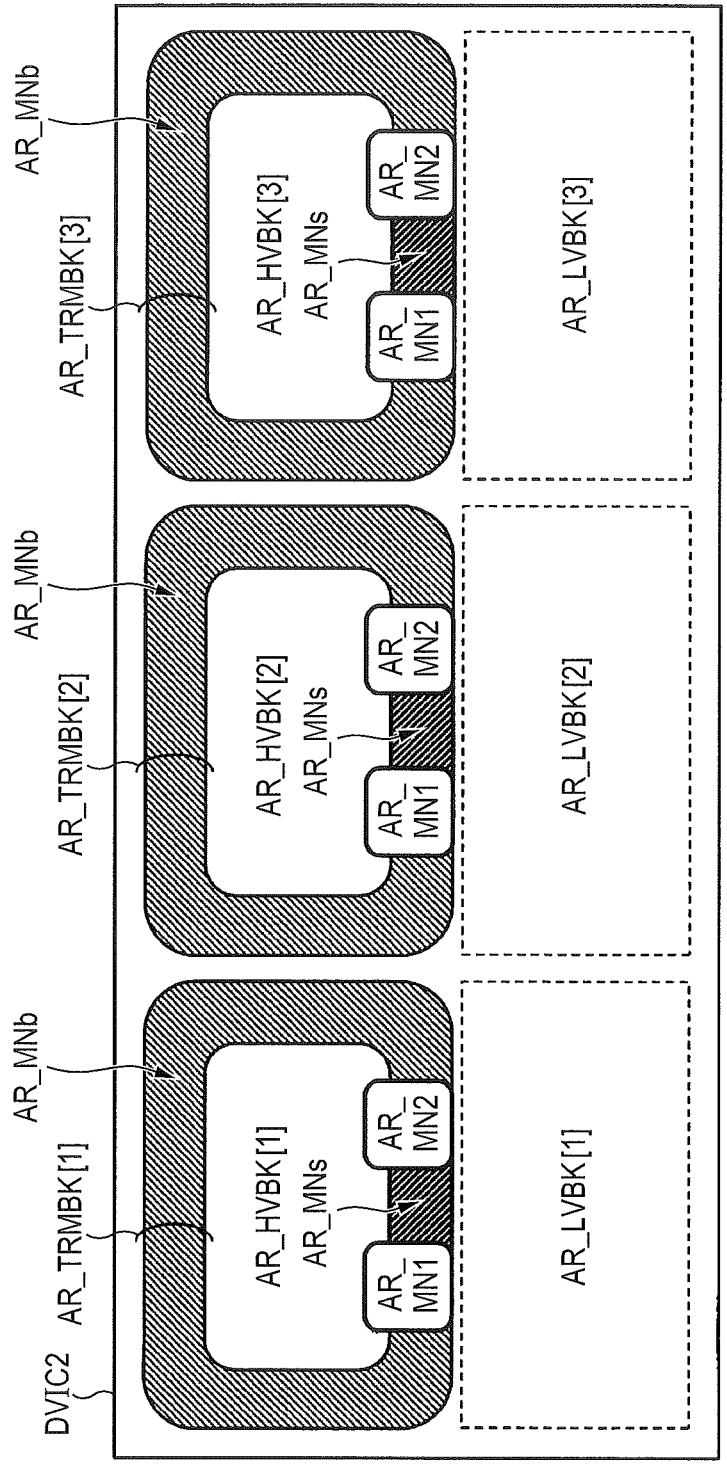
FIG. 11 is a plan view showing an example of the schematic layout configuration of a driver IC in the electronic system shown in FIG. 10.

FIG. 11 is a plan view showing an example of a schematic layout configuration of the driver IC in the electronic system of FIG. 10. The driver IC (semiconductor device) DVIC2 shown in FIG. 11 is configured with a single semiconductor chip, in which three of each of the regions (the termination region AR_TRMBK, the low voltage region (first region) AR_HVBK, and the high voltage region (second region) AR_HVBK) shown in FIG. 5 are respectively provided in the semiconductor chip. Although not particularly limited, in the example of FIG. 11, three of the termination regions AR_TRMBK shown in FIG. 5 are arranged side by side in a first direction, and three of the low voltage region (first regions) AR_LVBK are also arranged side by side in the first direction.

The circuit blocks for U phase described in FIG. 10 are formed in the termination region AR_TRMBK [1], the low voltage region AR_HVBK [1], and the high voltage region AR_HVBK[1]. The circuit blocks for V phase described in FIG. 10 are formed in the termination region AR_TRMBK [2], the low voltage region AR_LVBK [2], and the high voltage region AR_HVBK [2]. Then, the circuit blocks for W phase described in FIG. 10 are formed in the termination region AR_TRMBK [3], the low voltage region AR_HVBK [3], and the high voltage region AR_HVBK [3].

<Schematic Package Configuration of the Power Control Device>

Figure 12:
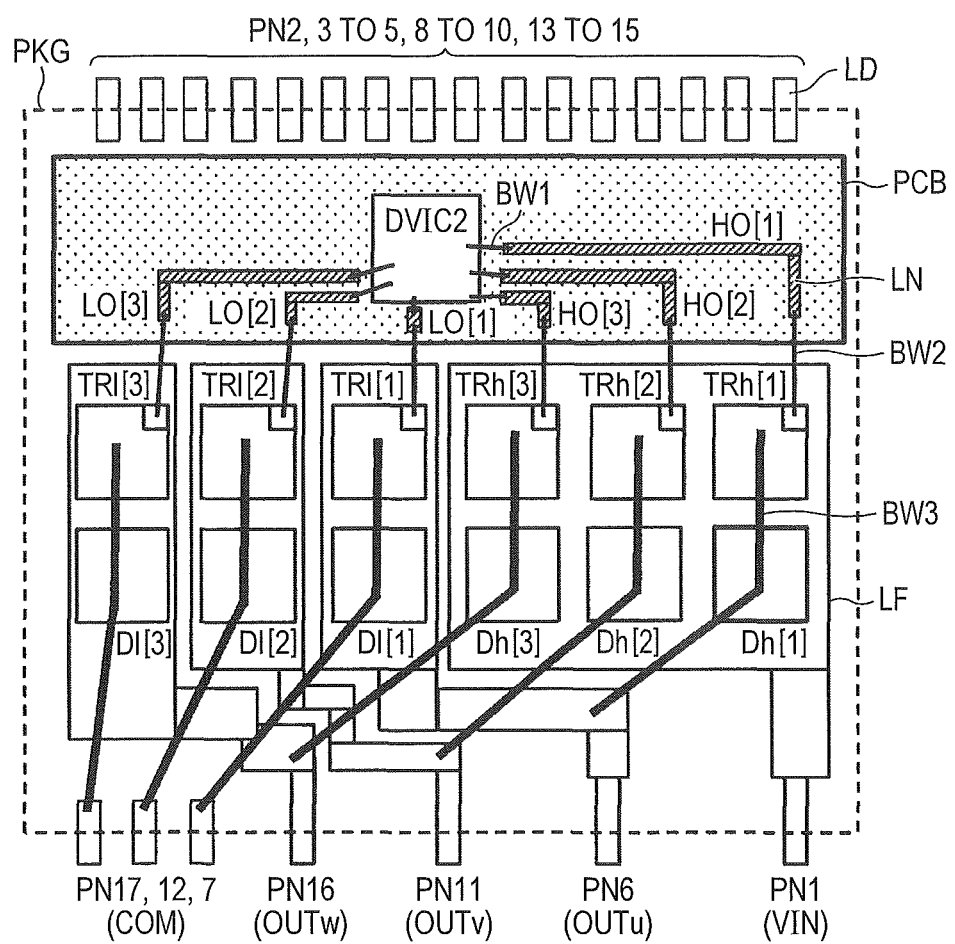
FIG. 12 is a plan view showing an example of the schematic package configuration of a power control device in the electronic system shown in FIG. 10.

FIG. 12 is a plan view showing an example of a schematic package configuration of the power control device in the electronic system shown in FIG. 10. The power control device PKG shown in FIG. 12 includes a wiring substrate PCB such as for example a glass epoxy substrate, a lead frame LF, and a plurality of leads LD corresponding to each of the external pins PN1 to PN17 shown in FIG. 10. All of the components are sealed by a sealing material such as an epoxy resin.

The driver IC (semiconductor device) DVIC2 is mounted on the wiring substrate PCB. In the example of FIG. 12, four lead frames LF (referred to as LF1 to LF4) are provided. The lead frame LF1 is integrated into the external pin PN1 combined with the external power supply voltage VIN. Further, three high side transistors TR [1] to TRh [3] as well as three high side diodes Dh [1] to Dh [3] are mounted on the lead frame LF1.

The lead frame LF2 is integrated into the external pin PN6 (lead LD) that outputs the U-phase load drive signal OUTu. The low side transistor TRl [1] and the low side diode Dl [1] are mounted on the lead frame LF2. The lead frame LF3 is integrated into the external pin PN11 (lead LD) that outputs the V-phase load drive signal OUTv. The low side transistor TRl [2] and the low side diode Dl [2] are mounted on the lead frame LF3. The lead frame LF4 is integrated into the external pin PN16 (lead LD) that outputs the W-phase load drive signal OUTw. The low side transistor TRl [3] and the low side diode Dl [3] are mounted on the lead frame LF 4.

Each of the three high side transistors TRh [1] to TRh [3] and each of the three low side transistors TRl [1] to TRl [3] has a vertical device structure in which the source electrode and the gate electrode are provided on the surface, with the mounting surface of the lead frame LF (namely, the rear surface) as the drain electrode. Further, each of the three high side diode Dh [1] to Dh [3] and each of the three low side diode Dl [1] to Dl [3] has a vertical device structure in which the anode electrode is provided on the surface, with the mounting surface of the lead frame LF (namely, the rear surface) as the cathode electrode.

The source electrode of the high side transistor TRh [1], the anode electrode of the high side diode Dh [1], and the external pin PN6 are combined with each other by a bonding wire BW3. Similarly, the source electrode of the high side transistor TRh [2], the anode electrode of the high side diode Dh [2], and the external pin PN11 are combined with each other by the bonding wire BW3. Then, the source electrode of the high side transistor TRh [3], the anode electrode of the high sided diode Dh [3], and the external pin PN16 are combined with each other by the bonding wire BW3.

Further, the source electrode of the low side transistor TRl [1], the anode electrode of the low side diode Dl [1], and the external pin PN7 that is combined with the reference voltage COM are combined with each other by the bonding wire BW3. Similarly, the source electrode of the low side transistor TRl [2], the anode electrode of the low side diode Dl [2], and the external pin PN12 that is combined with the reference voltage COM are combined with each other by the bonding wire BW3. Then, the source electrode of the low side transistor TRl [3], the anode electrode of the low side diode Dl [3], and the external pin PN17 that is combined with the reference voltage COM are combined with each other by the bonding wire BW3.

Meanwhile, six signal lines LN are formed on the wiring substrate PCB to transmit the high side output signals HO [1] to HO [3] and low side output signals LO [1] to LO [3] for the U, V, and W phases, respectively. Further, three pads (corresponding to the pad P5 shown in FIG. 1) that output the high side output signals HO [1] to HO [3], as well as three pads (corresponding to the pad P7 shown in FIG. 1) that output the low side output signals LO [1] to LO [3] are arranged on the surface of the driver IC (DVIC2). Each of the six pads is combined with one end of each of the six signal lines LN through a bonding wire BW1. Further, the other end of each of the six signal lines LN is combined with the gate electrode of each of the three high side transistors TRh [1] to TRh [3] and each of the three low side transistors TRl [1] to RT1 [3], through a bonding wire BW2.

Further, although not shown, other pads arranged on the surface of the driver IC (DVIC2) are combined with the other external pins (PN2, 3 to 5, 8 to 10, and 13 to 15) included in the power control device PKG, through a bonding wire and a line on the wiring substrate PCB, or directly by the bonding wire. As described above, the use of the wiring substrate PCB allow, for example, easy assignment of the configuration space for the bonding wire, and the like.

<Typical Effects and the Like of the Second Embodiment>

As described above, by using the driver IC (semiconductor device) DVIC2 and the power control device PKG according to the second embodiment, it is possible to achieve further reduction in the size, cost, or the like of the power control device as well as the electronic system including the power control device, in addition to the various effects described in the first embodiment. More specifically, for example, when the bootstrap diode is used as in the conventional method, the diode may be mounted on the wiring substrate PCB of FIG. 12.

However, in this case, the region assigned to the wiring on the wiring substrate PCB described above is reduced, and the assignment of the arrangement space of the bonding wire may be difficult due to the reduction in the flexibility of the wiring. Further, the cost of the power control device PKG and the electronic system may increase due to the mounting of the diode. Such problems become more significant as the number of high side and low side transistors (six in the example of FIG. 10) controlled by the power control device PKG increases.

On the other hand, when the method of the second embodiment is used, in which the driver IC (semiconductor device) DVIC2 has the same function as the bootstrap diode, it is possible to increase the flexibility of the wiring on the wiring substrate PCB, and to reduce the cost because the diode is not mounted. In addition, as described in the first embodiment, the same function as the bootstrap diode can be incorporated into the driver IC (DVIC2) while suppressing an increase in the circuit area, so that the chip size of the driver IC (DVIC2) can be reduced. As a result, a further increase in the flexibility of the wiring on the wiring substrate PCB can be achieved.

Note that FIG. 10 exemplifies the semiconductor device and the power control device to achieve power control of the three-phase bridge inverter. However, the method of the present embodiment is not limited to this example, and is also applicable to a device for achieving power control of one phase of the three-phase bridge inverter (namely, a pair of high side and low side transistors), a device for achieving power control of a single-phase bridge inverter configured with two pairs of high side and low side transistors, or the like. Also in this case the same effects can be obtained.

However, as described above, in the method according to the present embodiment, more useful effects can be obtained as the number of high side and low side transistors to be controlled by one semiconductor device and by one power control device increases.

In the foregoing, the invention made by the present inventors has been concretely described based on the embodiments. However, it is needless to say that the present invention is not limited to the foregoing embodiments and various modifications and alterations can be made within the scope of the present invention. For example, the foregoing embodiments have been described in detail to clearly explain the present invention, and are not necessarily limited to those having all the configurations described in the exemplary embodiments. Further, part of the configuration of an embodiment can be replaced with the configuration of another embodiment, and the configuration of an embodiment can be added with the configuration of another embodiment. Furthermore, the addition, deletion, and replacement of another configuration can be made with respect to part of the configuration of each embodiment.

What is claimed is:

1. A driver integrated circuit, comprising:
   a bootstrap circuit configured to output a boot power supply voltage based on a first power supply voltage, the boot power supply voltage being higher than the first power supply voltage;
   a level shift circuit configured to output an output pulse signal based on an input pulse signal and the boot power supply voltage;
   a high side driving circuit configured to output a high side driving voltage based on the boot power supply voltage and the output pulse signal,
   wherein the bootstrap circuit includes a sense metal oxide semiconductor transistor and a boot metal oxide semiconductor transistor,
   wherein the sense metal oxide semiconductor transistor comprises a depression-type transistor.

2. A driver integrated circuit according to claim 1,
   wherein the sense metal oxide semiconductor transistor produces a sense voltage based on the boot power supply voltage and the first power supply voltage, and
   wherein the bootstrap circuit includes a comparator circuit which drives the boot metal oxide semiconductor transistor based on a difference between the first power supply voltage and the sense voltage.

* * * * *